(12) United States Patent
Sinclair et al.

(10) Patent No.: US 8,309,935 B2
(45) Date of Patent: Nov. 13, 2012

(54) END TERMINATIONS FOR ELECTRODES USED IN ION IMPLANTATION SYSTEMS

(75) Inventors: Frank Sinclair, Quincy, MA (US); Svetlana B. Radovanov, Marblehead, MA (US); Kenneth H. Purser, Lexington, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 304 days.

(21) Appl. No.: 12/418,053

(22) Filed: Apr. 3, 2009

(65) Prior Publication Data
US 2010/0252746 A1    Oct. 7, 2010

(51) Int. Cl.
*H01J 3/14*    (2006.01)
(52) U.S. Cl. .............. 250/396 R; 250/492.1; 250/492.2; 250/492.21
(58) Field of Classification Search .............. 250/396 R, 250/492.1, 492.2, 492.21
See application file for complete search history.

(56) References Cited

U.S. PATENT DOCUMENTS

| 5,780,863 | A | * | 7/1998 | Benveniste et al. | ...... 250/492.21 |
| 2006/0113491 | A1 | * | 6/2006 | Kawaguchi et al. | ..... 250/492.21 |
| 2007/0108390 | A1 | * | 5/2007 | Radovanov et al. | ...... 250/396 R |
| 2007/0164229 | A1 | * | 7/2007 | Radovanov et al. | ...... 250/396 R |
| 2008/0258074 | A1 | * | 10/2008 | Tsukihara et al. | ........ 250/396 R |
| 2010/0171042 | A1 | * | 7/2010 | Kellerman et al. | ....... 250/396 R |

FOREIGN PATENT DOCUMENTS
JP    2005235697 A    9/2005

* cited by examiner

*Primary Examiner* — Michael Logie

(57) ABSTRACT

An ion implantation system includes an electrostatic lens. The electrostatic lens includes a terminal electrode, a ground electrode and a suppression electrode disposed therebetween. An ion beam enters the electrostatic lens through the terminal electrode and exits through the ground electrode. The electrodes have associated electrostatic equipotentials. An end plate is disposed between a top and bottom portion of the suppression electrode and/or the top and bottom portion of the ground electrode. The respective end plate has a shape which corresponds to the electrostatic equipotential associated with the particular electrode in order to maintain uniformity of the beam as it passes through the electrostatic lens.

2 Claims, 5 Drawing Sheets

END TERMINATIONS FOR ELECTRODES USED IN ION IMPLANTATION SYSTEMS

BACKGROUND OF THE INVENTION

1. Field of the Invention

Embodiments of the invention relate to the field of ion implantation. More particularly, the present invention relates to end terminations for electrodes used in ion implant tools to control unwanted beam aberrations.

2. Discussion of Related Art

Ion implantation is a process used to dope ions into a work piece. One type of ion implantation is used to implant impurity ions during the manufacture of semiconductor substrates to obtain desired electrical device characteristics. Typically, arsenic or phosphorus may be doped to form n-type regions in the substrate and boron, gallium or indium is doped to create p-type regions in the substrate.

An exemplary high current ion implanter tool 100 is generally shown in FIG. 1 and includes an ion source chamber 102, and a series of beam line components that direct the ion beam onto a wafer or substrate. These components are housed in a vacuum environment and configured to provide ion dose levels with low energy for shallow ion implantation. In particular, implanter 100 includes an ion source chamber 102 to generate ions of a desired species. The chamber has an associated heated filament powered by power supply 101 to ionize feed gas introduced into the chamber 102 to form charged ions and electrons (plasma). The heating element may be, for example, an indirectly heated cathode. Different feed gases are supplied to the source chamber to generate ions having particular dopant characteristics. The ions are extracted from source chamber 102 via a standard three (3) extraction electrode configuration used to create a desired electric field to focus ion beam 95 extracted from source chamber 102. Beam 95 passes through a mass analyzer chamber 106 having a magnet which functions to pass only ions having the desired charge-to-mass ratio to a resolving aperture. In particular, the analyzer magnet includes a curved path where beam 95 is exposed to the applied magnetic field which causes ions having the undesired charge-to-mass ratio to be deflected away from the beam path. Deceleration stage 108 (also referred to as a deceleration lens) includes a plurality of electrodes (e.g. three) with a defined aperture and is configured to output the ion beam 95. A magnet analyzer 110 is positioned downstream of deceleration stage 108 and is configured to deflect the ion beam 95 into a ribbon beam having parallel trajectories. A magnetic field may be used to adjust the deflection of the ions via a magnet coil. The ribbon beam is targeted toward a work piece which is attached to a support or platen 114. An additional deceleration stage 112 may also be utilized which is disposed between collimator magnet chamber 110 and support 114. Deceleration stage 112 (also referred to as a deceleration lens) may also include a plurality of electrodes (e.g. three) to implant the ions into the substrate at a desired energy level. Because the ions lose energy when they collide with electrons and nuclei in the substrate, they come to rest at a desired depth within the substrate based on the acceleration energy.

The ribbon beam is typically orthogonally directed to the work piece supported by platen 114 to implant the ions into the crystal lattice of the work piece. The depth of ion implantation is based on the ion implant energy and ion mass. Smaller electronic device sizes require high beam current densities implanted at low energy levels (for example $\leq 2$ keV). Typically, low energy ion beams diverge as they travel through an ion implanter because of beam "blow-up" which is due to the effect of the space charge. This effect is caused by the mutual repulsion of the positively charged ions in the beam causing the beam to diverge and grow in cross section. Thus, it has become typical to extract the beam from a plasma and analyze the desired ions at a relatively high energy and then only decelerate the beam to the final energy near the end of the beamline. This is accomplished by a deceleration lens. By applying different combinations of voltage potentials to the plurality of electrodes, the deceleration lens (108, 112) manipulates ion energies associated with the ion beam 95 and cause the ion beam to hit the work piece at a desired energy level to control implantation. In particular, the ions in an ion beam may be decelerated using lens (108, 112) without changing direction of the beam as it passes through the respective lens. However, the voltage potentials applied to the electrodes to decelerate the ions also produce aberrations in the equipotentials at the edges of the electrodes which distort or spread the beam shape. This problem typically arises in a ribbon beam high current tool as described above, but also occurs in a scanned beam tool that can be aimed at high current, medium current or high energy applications. In these cases the wide dimension of the effective beam is created by a narrow pencil beam that sweeps backwards and forwards at high frequency.

In order to correct for or minimize these aberrations, prior attempts have been made to change the geometry of the electrodes. For example, electrodes in a deceleration lens have been bent or angled at the edges to focus the beam and counteract the spreading effect. This attempt has achieved limited success. Alternatively, the electrodes have been configured to extend wider across the beam such that these aberrations are present far outside the beam path. This can be successful, however, when the widths of the electrodes are restrained by the mechanical structure of the vacuum chamber within the implanter. Thus, there is a need for a lens having a plurality of electrodes that terminates an associated electrostatic field of an electrode across the beam path without introducing aberrations that distort beam optics as the beam travels through the lens.

SUMMARY OF THE INVENTION

Exemplary embodiments of the present invention are directed to an electrostatic lens used in an ion implanter. In an exemplary embodiment, an electrostatic lens assembly includes a terminal electrode configured to receive an ion beam between a top and bottom portion. A ground electrode is configured to exit the ion beam from the electrostatic lens assembly between a top and bottom portions. A suppression electrode, disposed between the terminal and ground electrodes, is defined by a top and bottom portion wherein the ion beam is transmitted there between. The suppression electrode has an associated electrostatic equipotential. An end plate is disposed between the top and bottom portions of the suppression electrode at the edge of the beam and has shape corresponding to the electrostatic equipotential associated with the suppression electrode near the middle of the lens. Shaping the electrode end plate in this way assures that the electric field and the consequent ion focusing is uniform across the width of the beam.

DESCRIPTION OF EMBODIMENTS

Figure 1:
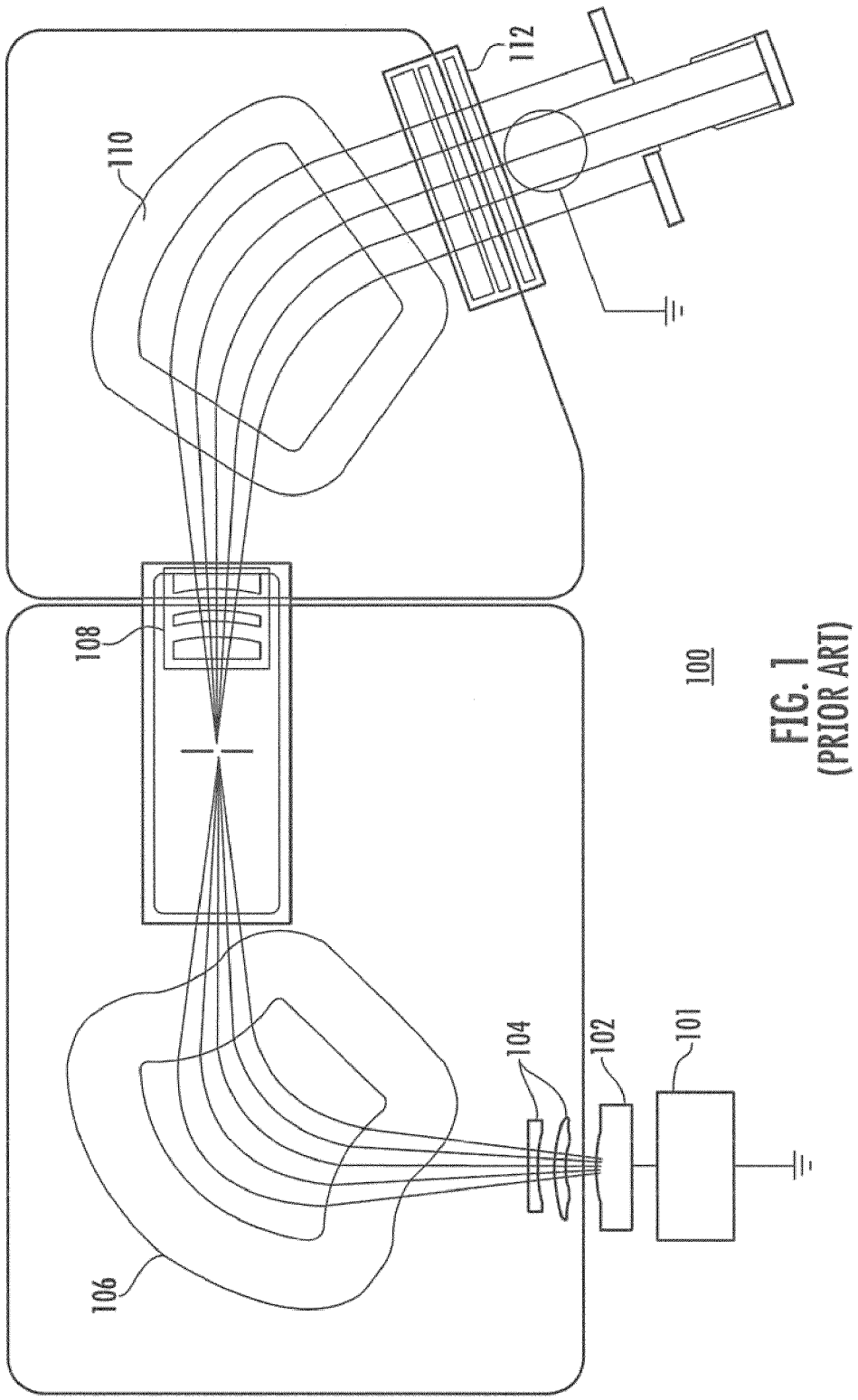
FIG. 1 is a block diagram of a conventional ion implanter tool.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 2:
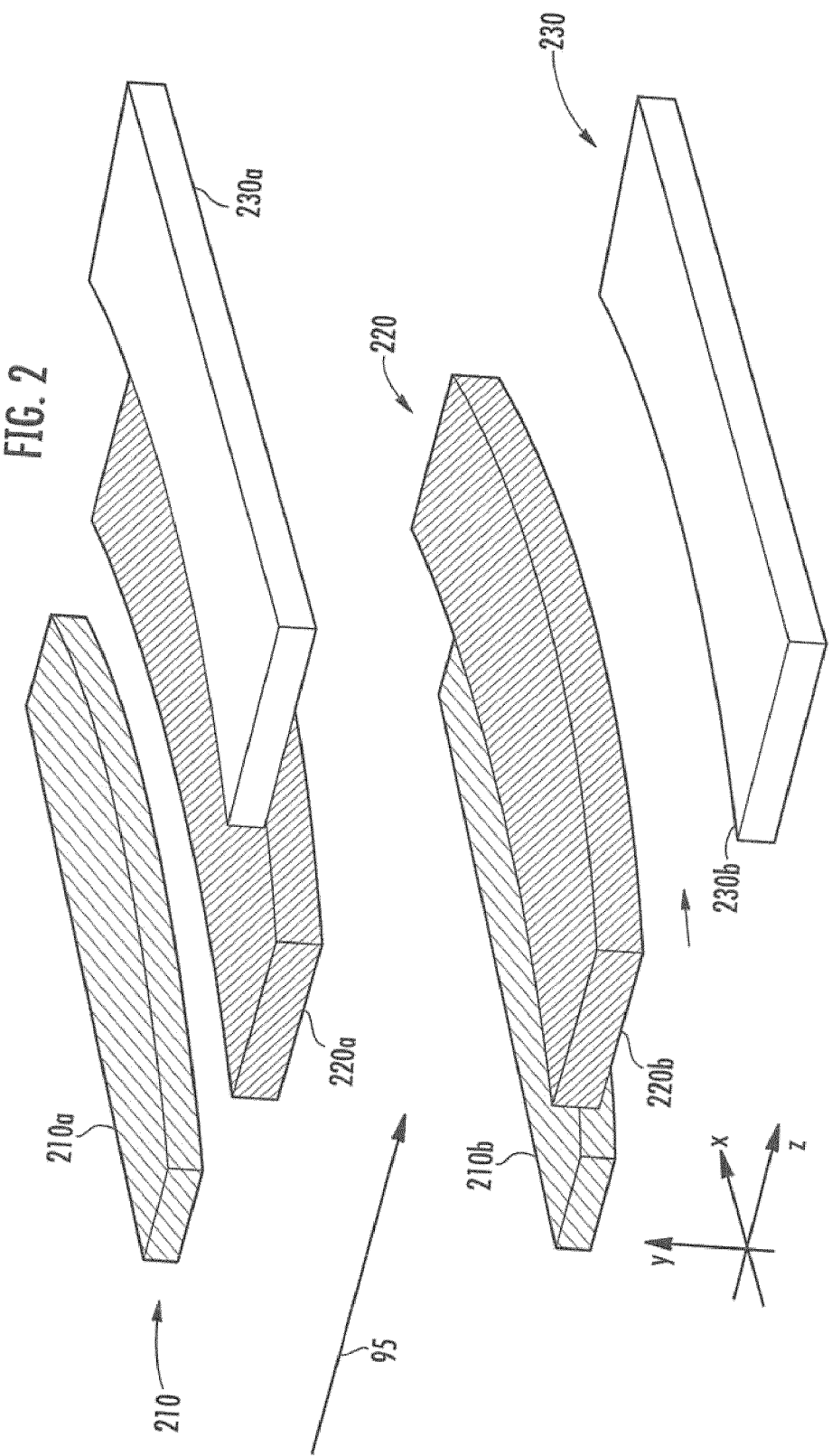
FIG. 2 is a perspective view of an exemplary electrostatic lens in accordance with an embodiment of the present invention.

FIG. 2 is a perspective view of an exemplary electrostatic lens 108 or 112 shown in FIG. 1 having a terminal electrode 210, suppression electrode 220, and ground electrode 230. Each of the electrodes 210, 220 and 230 is defined by a respective top portion 210a, 220a, 230a and bottom portion 210b, 220b, 230b separated by a distance in the y direction. This distance defines an aperture between respective top and bottom portions of each electrode through which beam 95, having a width in the x direction and height in the y direction, passes through the lens in the z direction. Suppression electrode 220 is illustrated as a single arcuate electrode, but may also be a segmented electrode biased at individual potentials Alternatively, suppression electrode may be a non-segmented electrode. The voltage difference between the top and bottom portions of each of the terminal 210, suppression 220 and ground electrodes 230 can be used to deflect beam 95 as it passes through the lens. Alternatively, the top and bottom portions of each electrode may be electrically coupled to share the same voltage potential.

The electrostatic lens 108 (hereinafter the lens will be referred to as 108, but the description is equally applicable to lens 112) may be a deceleration lens configured to decelerate the ion beam 95 causing the beam to hit a target work piece at a desired implant energy. A voltage potential is applied to each of the terminal 210, suppression 220 and ground 230 electrodes to manipulate the ion energies of the beam as it travels through the electrostatic lens. In particular, ion beam 95 may have an initial energy of 10-20 keV and enters the electrostatic lens via terminal electrode 210 having a particular voltage potential. The ions in beam 95 may be accelerated between terminal electrode 210 and suppression electrode 220 and may have energy of, for example, 30 keV. The suppression electrode is biased with a negative voltage potential and the ground electrode 230 is biased at a voltage that is more positive then the terminal electrode such that the ions decelerate as they pass from the suppression electrode 220 to the ground electrode 230. Beam 95 may have energy of, for example, 3-5 keV or lower when it exits the electrostatic lens via ground electrode 230. However, when the ion energy is reduced between the suppression and ground electrodes, the ion beam 95 tends to expand or diverge in at least the x direction at the edges of the electrodes.

Figure 3:
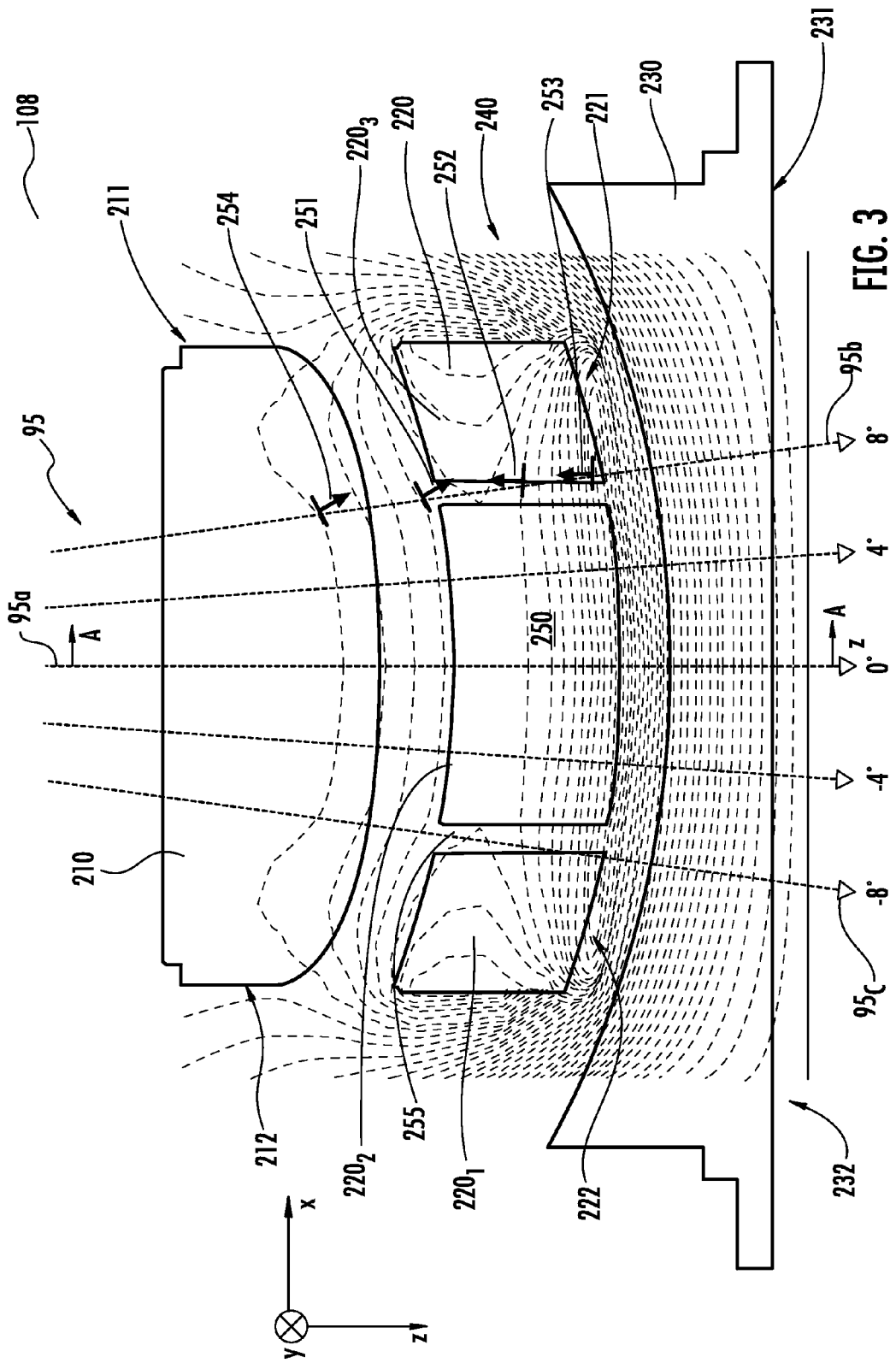
FIG. 3 is a top view of the electrodes shown in FIG. 2 illustrating associated exemplary voltage potentials in accordance with an embodiment of the present invention.

FIG. 3 is a top view of the electrodes shown in FIG. 2 including cultured lines 240 illustrating exemplary voltage potentials associated with terminal electrode 210, suppression electrode 220 and ground electrode 230. Suppression electrode 220 shown in FIG. 2 is shown in FIG. 3 as a segmented electrode having sections $220_1$, $220_2$, and $220_3$. The Beam 95 travels in the z direction through the lens and is defined by a mid-line 95a at 0° and outer perimeters 95b (e.g. 8° from mid-line 95a) and 95c (e.g. −8° from mid-line 95a) along the x direction. The equipotentials 240 about suppression electrode 220 in the area 250 are substantially perpendicular to the beam trajectory at mid-line 95a as the beam travels in the z direction though the lens. However, at the perimeters 95b and 95c of the beam 95, the beam trajectory is not perpendicular to the beam line. For example, beam line 95b is not perpendicular at the equipotential areas designated by arrows 251, 252, 253 and 255 associated with suppression electrode 220. In addition, beam line 95b is not perpendicular at the equipotential area designated at arrow 254 associated with terminal electrode 210. This indicates that the uniformity of the beam is not maintained at least in the x direction at the edges of the electrodes and the ions of the ion beam 95 will change direction as they travel through the lens via suppression electrode 220 and ground electrode 230. This is due to the aberrations at the edges of the electrodes, as indicated, for example, by arrows 251, 252, 253, 254 and 255. These aberrations distort the beam shape as the beam 95 travels through the lens. Because beam 95 has not significantly diverged from the mid-line 95 as it travels through the terminal electrode 210, the aberrations at the edges 211, 212 of the terminal electrode 210 are not within the path of beam 95 and do not compromise the beam optics.

Figure 4:
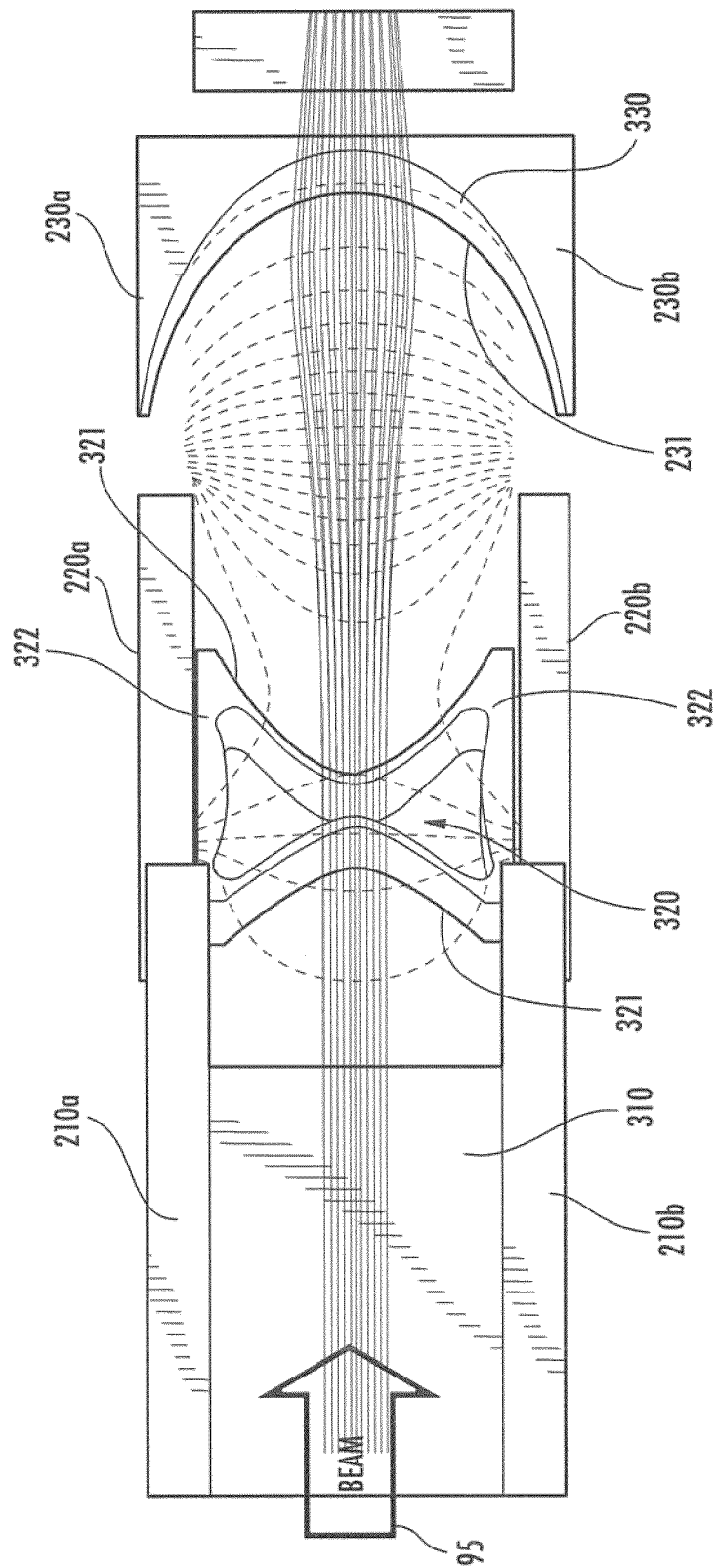
FIG. 4 is a segmented cross-sectional view taken along lines A-A of the electrodes illustrating end plate configurations in accordance with an embodiment of the present invention.

FIG. 4 is a segmented cross-sectional view of the terminal 210, suppression 220 and ground 230 electrodes taken along the mid line 95a in direction A-A of FIG. 3 to more particularly illustrate the end plates between respective top portions 210a, 220a, 230a and bottom portions 210b, 220b, 230b. In particular, end plate 320 is disposed between top portion 220a and bottom portion 220b of suppression electrode 220. Suppression electrode 220 may be biased, for example, at a lower potential than terminal electrode 210. This creates a relatively strong electric field which accelerates the positive ions of beam 95 as they travel from the terminal electrode 210 toward the suppression electrode 220 within the lens. End plate 320 may be a first end plate positioned in proximity to a first edge 221 (shown in FIG. 3) of the suppression electrode with a corresponding end plate disposed between the top 220a and bottom 220b portions in proximity to a second edge 222 (shown in FIG. 3) located in suppression electrode 220. As can be seen, end plate 320 has a generally hour glass shape with a pair of opposing curved sections 321 connected by transverse sections 322. The end plate 320 has a shape which corresponds to the electrostatic equipotential associated with suppression electrode 220 in order to maintain uniformity of the beam in the 'x' direction as it passes through the electrostatic lens. The end plate must be substantially rigid and may be used as a support for the top electrode. End plate 320 is made from an electrically conductive material such as aluminum and/or graphite. Because each end plate 320 is an electrical conductor, it imposes a boundary condition on the conductive surfaces of the suppression electrode 220 at the respective edges (221 and 222) as the beam 95 passes through the electrodes. In this manner, by employing an end plate having a shape which mimics the applied equipotentials near the middle of the electrode, the uniformity of beam 95 is maintained along the x direction to the edges of the suppression electrode as the beam travels through the lens.

An end plate 330 is disposed between top portion 230a and bottom portion 230b of ground electrode 230. The shape of end plate 330 corresponds to the electrostatic equipotential associated with ground electrode 230. As mentioned above, ground electrode may be biased, for example, at a potential that is the same as or similar to a potential of a target workpiece which receives ion beam 95. In this embodiment, ground electrode 230 is biased at ground potential which decelerates the ions in beam 95 for implantation. End plate 330 shown in FIG. 4 may be a first end plate positioned in proximity to a first edge 231 (shown in FIG. 3) of the ground electrode with a corresponding end plate disposed between the top 230a and bottom 230b portions in proximity to a second edge 232 (shown in FIG. 3) of ground electrode 230. As can be seen, end plate 330 has a generally concave interior section 331 disposed toward suppression electrode 220. The shape of end plate 320 corresponds to the electrostatic equipotential associated with ground electrode 230 in order to maintain uniformity of the beam in the x direction as it passes through the electrostatic lens. Similar to suppression end plate 320, ground electrode end plate 330 is made from an electrically conductive material such as aluminum and/or graphite and imposes a boundary condition on the conductive surfaces of the ground electrode 230. In this manner, by employing an end plate 330 having a shape which mimics the equipotential of the ground electrode, the uniformity of beam 95 is maintained along the x direction as the beam travels through the lens.

An end plate 310 is disposed between top portion 210a and bottom portion 210b of terminal electrode 210. Terminal electrode 210 may be biased, for example, at the same or similar potential as the incoming ion beam 95. As mentioned above, beam 95 has not significantly diverged from the mid-line 95a (shown in FIG. 3) as it travels through terminal electrode 210. The equipotential aberrations at the edges 211, 212 of terminal electrode 210 are far removed from the path of beam 95 in the x direction and do not affect the ions through this electrode. Thus, no special shape of the end plate 310 is required in this exemplary embodiment to maintain uniformity of the beam.

Figure 5:
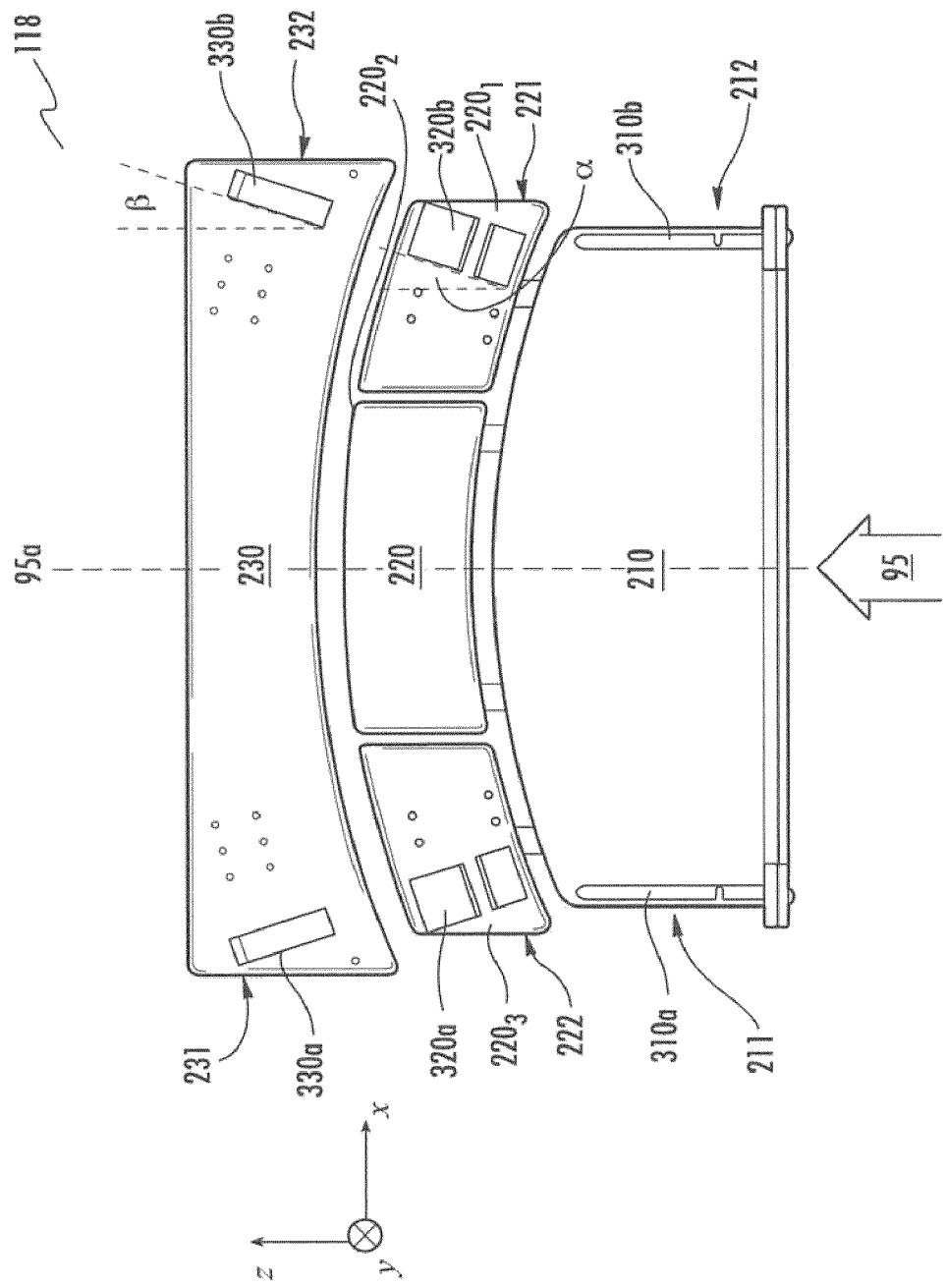
FIG. 5 is a top plan cut away of the bottom portions of the electrodes and the associated end plates in accordance with an embodiment of the present invention.

FIG. 5 is a top plan cut-away view of the bottom portions of the electrodes and the positioning of the associated end plates in an exemplary embodiment. In particular, beam 95 enters lens 118 via terminal electrode 210 and travels in the Z direction. Terminal electrode 210 includes end plate 310a positioned at first edge 211 and end plate 310b positioned at second edge 212. Suppression electrode 220 is disposed between terminal electrode 210 and ground electrode 230. Suppression electrode 220 is illustrated as a segmented electrode having three sections or segments, $220_1$, $220_2$ and $220_3$, but may also be a single arcuate electrode. End plate 320a is positioned at a first edge 221 of suppression electrode 220 and end plate 320b is positioned at second edge 222 of suppression electrode 220. The first edge 221 is associated with segment $220_1$ and the second edge is associated with segment $220_3$. However, suppression electrode 220 may not be a segmented electrode and may instead have a unitary configuration. In this exemplary embodiment, end plates 320a and 320b are positioned at an angle α with respect to the ion beam trajectory in the z direction. The positioning of the end plates 320a and 320b are illustrated at the edges of the suppression electrode to accommodate a wide focus beam. Alternatively, the end plates 320a, 320b may be positioned more toward the mid-line 95a of beam 95 to accommodate a more focused beam trajectory. End plate 330a is positioned at a first edge 231 of ground electrode 230 and end plate 330b is positioned at a second edge 232 of ground electrode 230. End plates 330a and 330b are positioned at an angle β with respect to the ion beam trajectory in the z direction.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. An electrostatic lens assembly for use in an ion implanter, said assembly comprising:

a terminal electrode defined by a top and bottom portion, each of said top and bottom portions having respective edges at an end, said terminal electrode configured to receive an ion beam traveling in z direction between said top and bottom portions of said terminal electrode, said ion beam is defined by a width in an x direction in a plane orthogonal to the z direction and a height in a y direction vertical to the x direction in the plane as the beam travels through the lens assembly in the z direction;

a ground electrode defined by a top and bottom portion, said ground electrode configured to exit said ion beam from said assembly between said top and bottom portions of said ground electrode;

a suppression electrode defined by a top and bottom portion wherein said ion beam travels between said top and bottom portions of said suppression electrode, said suppression electrode disposed between said terminal and ground electrodes, said suppression electrode having an associated electrostatic equipotential; and an end plate disposed between the respective edges of said top and bottom portions of said suppression electrode, said end plate having an hour-glass shape corresponding to the electrostatic equipotential of said beam associated with a region of said suppression electrode.

2. The electrostatic lens assembly of claim 1 wherein the hour-glass shape of the end plate includes a curved portion having a radius of curvature parallel to the z direction.

* * * * *